United States Patent [19]

Hara

[11] Patent Number: 4,941,013
[45] Date of Patent: Jul. 10, 1990

[54] EXPOSURE DEVICE USING CRT AS EXPOSURE LIGHT SOURCE

[75] Inventor: Yoshimasa Hara, Nagoya, Japan

[73] Assignee: Brother Kogyo Kabushiki Kaisha, Aichi, Japan

[21] Appl. No.: 338,119

[22] Filed: Apr. 14, 1989

[30] Foreign Application Priority Data

Apr. 14, 1988 [JP] Japan ............................ 63-49404[U]

[51] Int. Cl.$^5$ ........................ G03B 27/72; G03B 27/80
[52] U.S. Cl. ........................................ 355/20; 355/69; 358/244
[58] Field of Search ............................ 355/20, 68, 69; 358/244

[56] References Cited

U.S. PATENT DOCUMENTS 3,177,764  4/1965  Akima .................................. 355/20
3,400,632  9/1968  Wahli .................................. 355/20

FOREIGN PATENT DOCUMENTS 2135468A  2/1984  United Kingdom .

Primary Examiner—Richard A. Wintercorn
Attorney, Agent, or Firm—Oliff & Berridge

[57] ABSTRACT

An exposure device for an image exposure onto a photosensitive recording medium includes a cathode ray tube serving as an exposure light source which supplies an optical radiant energy onto the recording medium. The photosensitive recording medium has an $\gamma$ characteristic in a relation between the density of the image recorded thereon and an optical radiant energy applied thereto. For recording an image corresponding in density to an image of an original, there is provided a driver circuit which receives an input voltage indicative of the density of the image on the original and when the input voltage exceeds a predetermined value, an output voltage applied to the cathode ray tube to cause an image of 0% (white) in density to be recorded on the recording medium. When the input voltage is below the predetermined value, the output voltage is applied thereto which changes in proportion to the input voltage. Accordingly, not only the reproduction of the white color is ensured but also half-tone can faithfully be reproduced.

7 Claims, 1 Drawing Sheet

EXPOSURE DEVICE USING CRT AS EXPOSURE LIGHT SOURCE

BACKGROUND OF THE INVENTION

The present invention relates to an exposure device using a cathode ray tube (hereinafter referred to as "CRT") as an exposure light source to form a latent image on a photosensitive recording medium corresponding to a CRT image. More particularly, the invention relates to such an exposure device in which a sufficient amount of radiant energy is supplied from the CRT for compensating for the λ characteristic of a photosensitive recording medium.

It has been requested that a color image displayed on a multi-color CRT be directly recorded on a recording medium. To this end, a photosensitive recording medium is disposed to face the CRT screen through a focusing lens so that the recording medium is exposed to an image bearing light emanated from the CRT screen. In such an exposure device, a driver circuit is connected to the CRT and to the driver circuit a video signal generator is connected. The video signal generator generates video signals which include red signals, green signals and blue signals, and horizontal and vertical scan signals. The red, green and blue signals correspond to the three primary colors of light, i.e., red, green and blue, of the image to be reproduced. The horizontal and vertical scan signals represent positions of a multiplicity of horizontal and vertical scanning lines of the CRT screen. Namely, the horizontal and vertical signals represent the individual picture elements of a picture frame on the screen of the CRT. Source image information applied to the video signal generator is sent to a host computer from a suitable image reader connected thereto, or transmitted to the host computer from a remote transmitter. Alternatively, the source image information is produced by the host computer per se.

The driver circuit receives the video signals from the video signal generator at its input. In the driver circuit, the video signal is amplified with a constant amplification factor and an output voltage is supplied therefrom such that the amplified input voltage is subtracted from a constant power supply voltage applied to the driver circuit. Such an output voltage is applied to the cathode of the CRT, and the CRT produces an image on its screen in accordance with the voltage applied to the cathode. When a high level input voltage representative of, for example, a white color, is applied to the driver circuit from the video signal generator, the driver circuit supplies low level output voltage to the cathode of the CRT, thereby displaying a white color image on the CRT screen. The CRT screen provides a radiant energy corresponding to the image displayed thereon. In order to form a latent image on a photosensitive recording medium, it is necessary that the radiant energy supplied therefrom be in consistence with the λ characteristic of the recording medium.

In FIG. 3, the axis of abscissa represents a relative input voltage applied to the input of the driver circuit, which is defined by the actual input voltage divided by the actual input voltage applied when the density of the image of the original is zero, and the axis of ordinate represents the density of the image on the original. In FIG. 4, the axis of abscissa represents a relative output voltage of the driver circuit, which is defined by the actual output voltage divided by the actual output voltage causing to radiate an amount of energy with which the image recorded on the photosensitive recording medium is zeroed, and the axis of ordinate represents the density of the image recorded thereon. In the CRT driven with a driving circuit amplifying the input voltage at a predetermined amplification factor, the radiant energy supplied from the CRT changes linearly relative to the input voltage. More specifically, the input voltage applied to the driver circuit changes linearly relative to the density of the image on an original as shown in FIG. 3. The output voltage from the driver circuit and the amount of energy supplied from the CRT also change linearly to record the same density image on the photosensitive recording medium as shown in FIG. 4.

Therefore, when the photosensitive recording medium having the λ characteristic as indicated by a solid line in FIG. 2 is subjected to exposure by the use of the CRT driven by the voltage on a solid line c in FIG. 4, the radiant energy supplied from the CRT corresponding to the input voltage applied to the driver circuit or the density of the image on the original is as shown by a dotted line in FIG. 2. Hence, even if the input voltage corresponding to white color (density being 0%) of the original were inputted to the driver circuit, an amount of radiant energy required for recording the white color on the photosensitive recording medium would not be obtained. Similar inconsistency with the λ characteristic of the recording medium exists in recording a black color image (density being 100%), in which case the amount of radiant energy supplied from the CRT is excessive. However, the shortage of the amount of radiant energy in recording the white color image is more serious in that the finally reproduced image loses brightness as a whole.

In FIG. 2, the axis of abscissa represents a relative radiant energy defined by an actual radiant energy divided by an actual radiant energy for causing the density of the image recorded on the recording medium to 0%, and the axis of ordinate represents the density of the image recorded on the recording medium.

SUMMARY OF THE INVENTION

Accordingly, it is an object of this invention to provide an exposure device using a CRT as an exposure light source, in which when an input signal whose level exceeds a predetermined level is inputted to a driver circuit for driving the CRT, an output voltage is outputted therefrom so as to produce a sufficient amount of radiant energy from the CRT for causing the density of the image recorded on a photosensitive recording medium to 0%. A white color of the original is thus clearly reproducible.

In order to achieve the above and other objects, there is provided an exposure device for an image exposure onto a photosensitive recording medium to record thereon an image corresponding in density to an image on an original, the photosensitive recording medium having a non-linear characteristic in a relation between the density of the image recorded thereon and an optical radiant energy applied thereto, the device comprising:

a cathode ray tube for supplying the optical radiant energy onto the photosensitive recording medium;

a driver circuit receiving an input voltage indicative of the density of the image on the original and developing an output voltage applied to the cathode ray tube, wherein the cathode ray tube supplies the optical radiant energy in consistence with the non-linear characteristic in response to the output voltage.

The driver circuit applies a first output voltage to the cathode ray tube when the input voltage is below a predetermined value, the first output voltage causing the cathode ray tube to supply a first optical radiant energy corresponding to the first output voltage, the photosensitive recording medium being recorded with an image of substantially 0% in density when exposed to light of the first optical radiant energy. The driver circuit applies a second output voltage to the cathode ray tube when the input voltage is above the predetermined value, the second output voltage changing in proportion to the input voltage.

In a specific embodiment of the invention, the driver circuit comprises:

an amplifier having an input terminal supplied with the input voltage and an output terminal providing an amplified voltage;

a comparator having a first input terminal supplied with the input voltage, a second input terminal supplied with a reference voltage, and an output terminal providing a first output when the input voltage is above the reference voltage and a second output when the input voltage is below the reference voltage; and a differential amplifier having a non-inverting input terminal connected to the output terminal of the amplifier, an inverting input terminal connected to the output terminal of the comparator, and an output terminal providing the output voltage supplied to the cathode ray tube, the output voltage supplied thereto being a difference between the amplified voltage provided by the amplifier and one of the first and second outputs provided by the comparator.

DESCRIPTION OF THE PREFERRED EMBODIMENTS

As a photosensitive recording medium, a transfer type image recording medium as disclosed in U.S. Pat. No. 4,399,209 to Sanders et al or a self-contained type recording medium as disclosed in U.S. Pat. No. 4,440,846 also to Sanders et al is used in the embodiment of the present invention.

Briefly, the transfer type recording medium comprises a microcapsule sheet and a developer sheet. The microcapsule sheet is coated with an immense number of microcapsules on one surface thereof. The microcapsules separately encapsulate a photo-curing (or photo-softening) resin and a chromogenic material of one of three primary colors, i.e. cyan, magenta and yellow. The developer sheet has a surface coated with a developer material. When the microcapsule sheet is selectively exposed to light, the mechanical strength of the microcapsules in the exposed area is changed from soft to hard or vice versa to thereby form a latent image thereon corresponding to the pattern of the exposure. The latent image on the microcapsule sheet is developed under pressure to provide a visible image on the developer sheet by rupturing the microcapsules of weaker mechanical strength and having the chromogenic material released therefrom react with the developer material.

In the self-contained type recording medium, an encapsulated chromogenic material and a developer material are co-deposited on one surface of a single substrate as one layer or as two contiguous layers. The formation of the latent image and the development thereof are performed in the similar fashion as is done for the transfer type recording medium.

Figure 1:
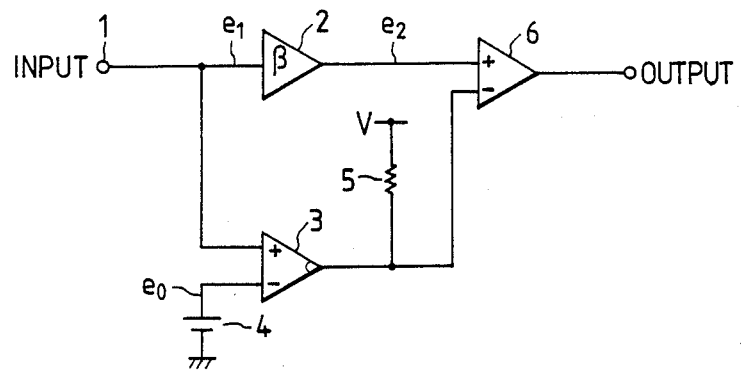
FIG. 1 is a block diagram of a driver circuit according to one embodiment of the present invention.
Figure 2:
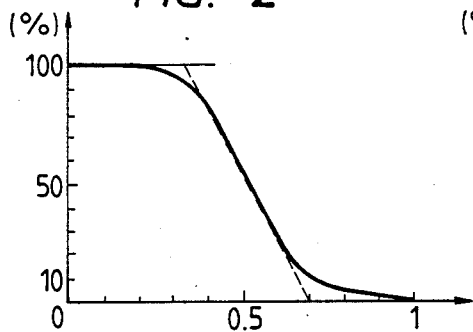
FIG. 2 is a graph representing a $\lambda$ characteristic of a photosensitive recording medium.
Figure 3:
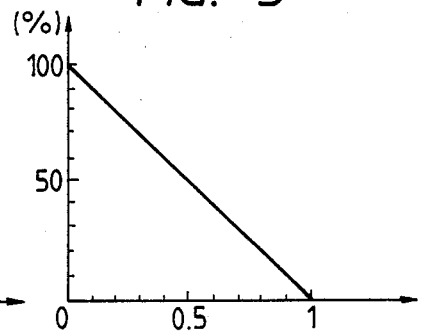
FIG. 3 is a graph representing a relation between an input voltage applied to a conventional driver circuit and the density of an image on an original.

FIG. 1 shows a driver circuit according to one embodiment of the present invention. An input terminal 1 is connected to both an amplifier 2 and the non-inverting input terminal of an open-collector type comparator 3. The inverting input terminal of the comparator 3 is connected to a reference voltage source 4. A transistor (not shown) is included in the comparator 3 in its output stage, and the collector of this transistor is connected through a pull-up resistor 5 to a voltage source V. The output of the comparator 3 is further connected to the inverting input terminal of a differential amplifier 6, the non-inverting input of which is connected to the output of the amplifier 2. The output of the differential amplifier 6 is connected to a CRT (not shown).

In operation, an input signal $e_1$ on the input terminal 1 is applied to the amplifier 2. Assuming that the amplification factor of the amplifier 2 is $\beta$, then the output voltage $e_2$ therefrom is $\beta e_1$. The input signal $e_1$ is further supplied to the non-inverting input terminal of the comparator 3 where the input signal $e_1$ is compared with a reference voltage $e_0$ applied to the inverting input terminal thereof. When the input voltage $e_1$ exceeds the reference voltage $e_0$, the output voltage from the comparator 3 becomes V, whereas when the input voltage $e_1$ is below the reference voltage $e_0$, the output voltage therefrom is zero.

Figure 4:
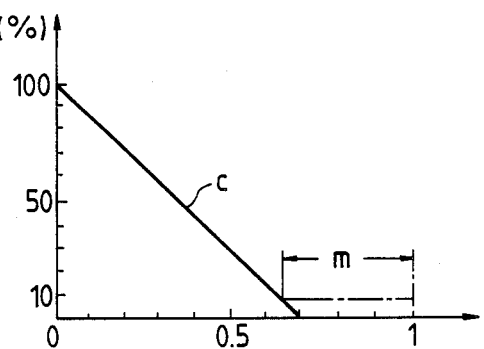
FIG. 4 is a graph representing a relation between an output voltage of the conventional driver circuit and the density of an image recorded on a photosensitive recording medium.

The differential amplifier 6 is supplied with the output voltage $e_2$ from the amplifier 2 in the non-inverting input terminal thereof and the output voltage from the comparator 3 in the inverting input terminal thereof, where a difference between these inputs are provided in the output. The amplification factor of the differential amplifier 6 is set to "1". Therefore, when the input voltage $e_1$ is greater than the voltage $e_0$, the output from the differential amplifier 6 is $\beta e_1 - V$. On the other hand, when the input voltage $e_1$ is equal to or smaller than the voltage $e_0$, the output from the differential amplifier 6 is $\beta e_1$. The reference voltage $e_0$ is set, for example, to an input voltage corresponding to 10% in the density of the image on the original. Therefore, an amount of radiant energy is produced from the CRT to cause the density of the image recorded on the photosensitive recording medium to 0% in response to the output voltage $\beta e_1 - V$ obtained when the input voltage $e_1$ is greater than the voltage $e_0$. That is, by setting the voltage V to a large value, a voltage $\beta e_1 - V$ causes the density of the image to be recorded on the photosensitive recording medium to 0% or less than 0% irrespective of the level of the input voltage $e_1$. Hence, the density of the image on the recording medium is thereby rendered 0%. The range in which the density of the image thereon is made to 0% is indicated by m in FIG. 4.

Although the present invention has been described with reference to a specific embodiment, it would be apparent for a person skilled in the art that many changes and modifications may be made without departing from the scope and spirit of the invention. For example, in lieu of the multi-color CRT, a combination of a white CRT and a color filter may be employed. Furthermore, three driver circuits may be provided for compensating for the λ characteristic of each of yellow, cyan and magenta microcapsules on the recording medium. Specifically, a first driver circuit is supplied with an input voltage indicative of a color image on an original and develops a first output voltage indicative of a red color. A second driver circuit is supplied with the input voltage and and develops a second output voltage indicative of a green color. A third driver circuit is supplied with the input voltage and develops a third output voltage indicative of blue color. The first, second and third output voltages outputted respectively from the first, second and third driver circuits are applied to the cathode ray tube. The photosensitive recording medium has three different λ characteristics depending upon the wavelengths of the light beams or optical radiant energy applied thereto. That is, the photosensitive recording medium has a first non-linear or a first λ characteristics in a relation between the density of an red color image recorded on the photosensitive recording medium and an optical radiant energy corresponding to the red color applied to said photosensitive recording medium, a second non-linear or a second λ characteristic in a relation between the density of a green color image recorded thereon and an optical radiant energy corresponding to the green color applied thereto and a third non-linear or a third λ characteristic in a relation between the density of a blue color image recorded thereon and an optical radiant energy corresponding to the blue color applied thereto.

As described, according to the present invention, in an exposure device using a CRT as an exposure light source, a driver circuit for driving the CRT is designed so that when an input voltage applied to the driver circuit exceeds a predetermined value, an output voltage is supplied therefrom to cause the density of the image recorded on the recording medium to 0% (white). On the other hand, when the input voltage applied thereto is below the predetermined value, the output voltage is supplied therefrom in proportion to the input voltage. Accordingly, not only the reproduction of the white color is ensured but also half-tones can faithfully be reproduced.

What is claimed is:

1. An exposure device for an image exposure onto a photosensitive recording medium to record thereon an image corresponding in density to an image on an original, the photosensitive recording medium having a non-linear characteristic in a relation between the density of the image recorded thereon and an optical radiant energy applied thereto, said device comprising:
    a cathode ray tube for supplying said optical radiant energy onto said photosensitive recording medium;
    a driver circuit receiving an input voltage indicative of said density of said image on said original and developing an output voltage applied to said cathode ray tube, wherein said cathode ray tube supplies said optical radiant energy in consistence with said non-linear characteristic in response to said output voltage;
    said driver circuit comprising means for applying a first output voltage to said cathode ray tube when said input voltage is above a predetermined value, said first output voltage causing said cathode ray tube to supply a first optical radiant energy corresponding to said first output voltage, said photosensitive recording medium being recorded with an image of substantially 0% in density when exposed to light of said first optical radiant energy.

2. An exposure device according to claim 1, wherein said driver circuit applies a second output voltage to said cathode ray tube when said input voltage is below said predetermined value, said second output voltage changing in proportion to said input voltage.

3. An exposure device for image exposure onto a photosensitive recording medium to record thereon an image corresponding in density to an image on an original, the photosensitive recording medium having a non-linear characteristic in a relation between the density of the image recorded thereon and an optical radiant energy applied thereto, said device comprising:
    a cathode ray tube for supplying said optical radiant energy onto said photosensitive recording medium;
    a driver circuit receiving an input voltage indicative of said density of said image on said original and developing an output voltage applied to said cathode ray tube, wherein said cathode ray tube supplies said optical radiant energy in consistence with said non-linear characteristic in response to said output voltage; said driver circuit comprising:
    an amplifier having an input terminal supplied with said input voltage and an output terminal providing an amplified voltage;
    a comparator having a first input terminal supplied with said input voltage, a second input terminal supplied with a reference voltage, and an output terminal providing a first output when said input voltage is above said reference voltage and a second output when said input voltage is below said reference voltage; and
    a differential amplifier having a non-inverting input terminal connected to said output terminal of said amplifier, an inverting input terminal connected to said output terminal of said comparator, and an output terminal providing said output voltage supplied thereto being a difference between said amplified voltage provided by said amplifier and one of said first and second outputs provided by said comparator.

4. An exposure device for image exposure onto a photosensitive recording medium to record thereon an image corresponding in density to an image on an original, the photosensitive recording medium having a non-linear characteristic in a relation between the density of the image recorded thereon and an optical radiant energy applied thereto, said device comprising:
    a cathode ray tube for supplying said optical radiant energy onto said photosensitive recording medium;
    a driver circuit receiving an input voltage indicative of said density of said image on said original and developing an output voltage applied to said cathode ray tube, wherein said cathode ray tube supplies said optical radiant energy in consistence with said non-linear characteristic in response to said output voltage; said driver circuit comprising:
    a first driver circuit receiving an input voltage indicative of a color image on an original and developing a first output voltage indicative of a red color applied to said cathode ray tube, a second driver circuit receiving said input voltage and developing a second output voltage indicative of a green color applied thereto, and a third driver circuit receiving said input voltage and developing a third output voltage indicative of blue color applied thereto.

5. An exposure device according to claim 4, wherein said photosensitive recording medium has a first non-linear characteristics in a relation between the density of an red color image recorded on said photosensitive recording medium and an optical radiant energy corresponding to said red color applied to said photosensitive recording medium, a second non-linear characteristic in a relation between the density of a green color image recorded thereon and an optical radiant energy corresponding to said green color applied thereto and a third non-linear characteristic in a relation between the density of a blue color image recorded thereon and an optical radiant energy corresponding to said blue color applied thereto.

6. An exposure device according to claim 5, wherein said photosensitive recording medium has a surface coated with a plurality of microcapsules separately encapsulating a photo-curing resin and a chromogenic material of one of three primary colors selected from cyan, magenta and yellow.

7. An exposure device according to claim 5, wherein said photosensitive recording medium has a surface coated with a plurality of microcapsules separately encapsulating a photo-softening resin and a chromogenic material of one of three primary colors selected from cyan, magenta and yellow.

* * * * *